United States Patent [19]

Nagakubo

[11] Patent Number: 4,755,482

[45] Date of Patent: Jul. 5, 1988

[54] MAKING SEMICONDUCTOR DEVICE ON INSULATING SUBSTRATE BY FORMING CONDUCTIVE LAYERS ON BOTH MAJOR SURFACES

[75] Inventor: Yoshihide Nagakubo, Yokohama, Japan

[73] Assignee: Kabushiki Kaisha Toshiba, Kawasaki, Japan

[21] Appl. No.: 8,352

[22] Filed: Jan. 29, 1987

[30] Foreign Application Priority Data

Feb. 19, 1986 [JP] Japan ............................... 61-32697

[51] Int. Cl.⁴ .......................................... H01L 21/441
[52] U.S. Cl. ...................................... 437/84; 437/193; 437/195; 148/DIG. 150
[58] Field of Search ............. 156/662; 148/DIG. 150; 437/84, 180, 187, 189, 193, 194, 195

[56] References Cited

U.S. PATENT DOCUMENTS

| | | | |
|---|---|---|---|
| 4,428,111 | 1/1984 | Swartz | 156/647 X |
| 4,564,997 | 1/1986 | Matsuo et al. | 427/39 X |
| 4,598,461 | 7/1986 | Love | 357/23.4 |
| 4,644,637 | 2/1987 | Temple | 29/571 |

FOREIGN PATENT DOCUMENTS

| | | | |
|---|---|---|---|
| 3443793 | 6/1986 | Fed. Rep. of Germany | 29/590 |
| 0063673 | 5/1977 | Japan | 29/590 |

*Primary Examiner*—Olik Chaudhuri
*Attorney, Agent, or Firm*—Finnegan, Henderson, Farabow, Garrett and Dunner

[57] ABSTRACT

A method is disclosed for the manufacture of a multilayered interconnect structure on an insulating substrate. First and second conductive layers are formed on one and on the other (reverse) surfaces, respectively, of the insulating substrate. An insulating layer is formed, by means of a plasma CVD method, on the surface of the insulating substrate, to electrical insulation between interconnect layers. This is followed by a reactive ion etching step. This results in the formation of the aforementioned layer of a uniform thickness and having a uniform etching rate. That is, with the conductive layer formed on the rear surface of the insulating substrate, the complete insulating substrate is placed at the same potential level, whereby a uniform electrochemical reaction occurs on the surface thereof, resulting in the formation of the layers having a uniform etching rate, and in the formation of these layers each having the same thickness.

22 Claims, 5 Drawing Sheets

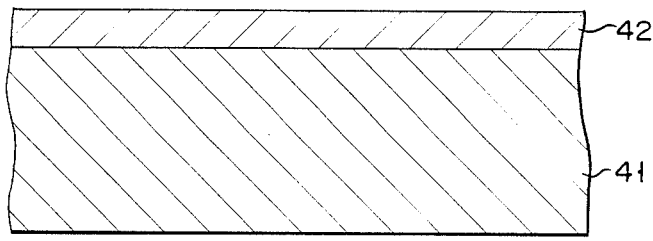
F I G. 1
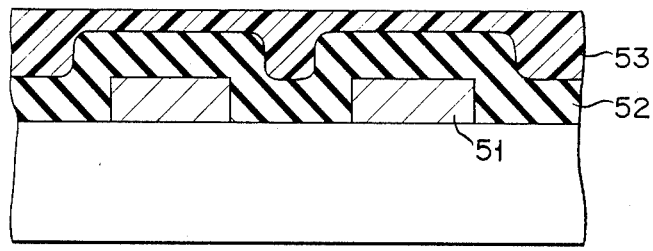
F I G. 2A
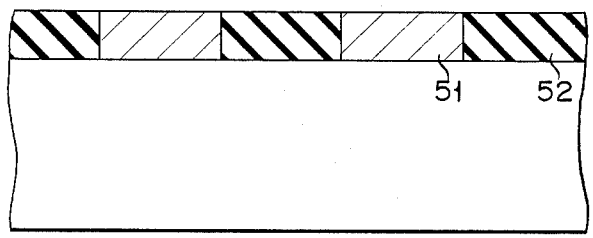
F I G. 2B
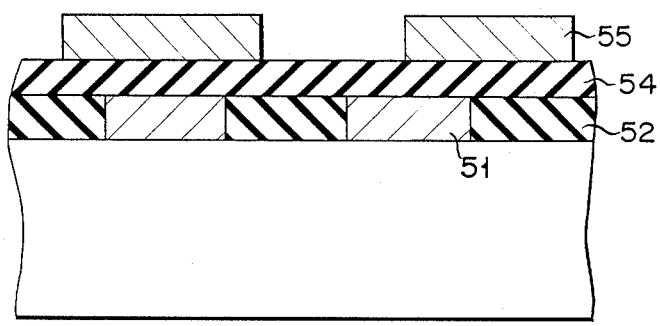
F I G. 2C

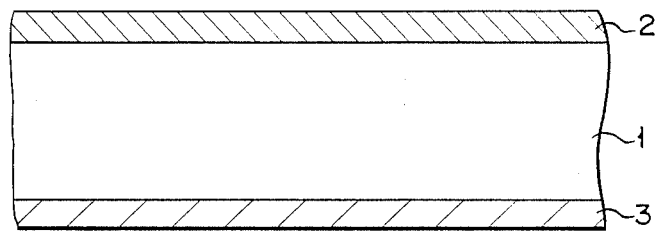
F I G. 3A
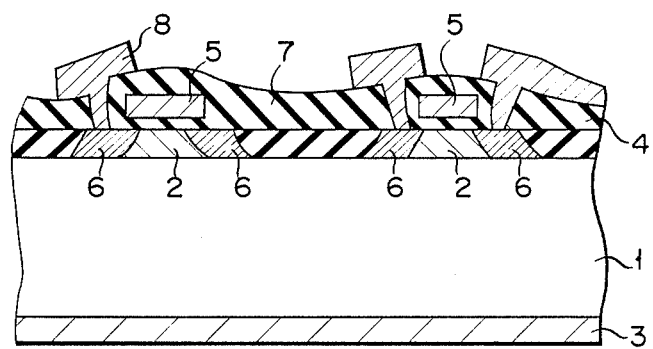
F I G. 3B
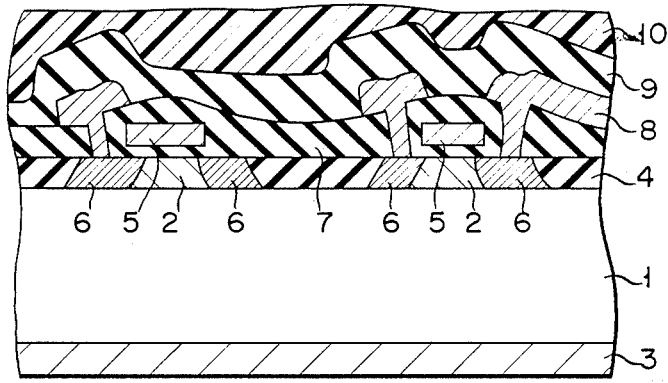
F I G. 3C

MAKING SEMICONDUCTOR DEVICE ON INSULATING SUBSTRATE BY FORMING CONDUCTIVE LAYERS ON BOTH MAJOR SURFACES

BACKGROUND OF THE INVENTION

This invention relates to a method for manufacturing a semiconductor device and, in particular, a method for manufacturing a semiconductor device, having a multi-layered interconnect structure, on an insulating substrate.

A SOS (Silicon On Sapphire) structure is conventionally known as a semiconductor structure having an insulating material as a substrate. The SOS structure is fabricated by epitaxially growing single crystalline silicon layer 42, as a semiconductive layer, on single crystalline sapphire substrate 41, and forming semiconductor elements on the silicon layer.

In the fabrication of the aforementioned SOS structure, several dry steps are performed in the process of forming semiconductor elements. The dry process includes, for example, a dry-etching step using plasma, a plasma CVD (Chemical Vapor Deposition) step, and so on.

The dry process, as opposed to a wet process using various types of acid or alkali solutions, comprises depositing and forming a thin film, through utilizing dissociated and ionized gaseous plasma resulting from a discharge occurring between opposite electrodes. Such a dry process contains an ion etching step comprising ionizing an inactive gas, and accelerating the ionized gas atoms, using a high voltage to cause them to collide with each other (i.e., utilizing physical energy); a plasma etching step utilizing a chemical reaction of active gas under a plasma phase; and an RIE (Reactive Ion Etching) step utilizing a combination of chemical and physical reactions.

Even in the aforementioned plasma CVD step, a thick film is deposited through utilizing the reaction of gas atoms under a plasma phase.

As a semiconductor device manufactured by using more dry steps, a semiconductor device of a type having, for example, a double-layered interconnect aluminum structure, is known.

In the formation of the aforementioned double-layered aluminum structure, an insulation interlayer should be planarized in the formation of a reliable interconnect line. In order to achieve this, an etchback method is known in the art. Stated in more detail, a layer which is formed during the formation of a first interconnect aluminum layer, is etched back to provide a planarized insulation interlayer. The process which manufactures semiconductor devices will now be explained below, with reference to FIGS. 2A to 2C.

Subsequent to the formation of first interconnect aluminum layer 51, insulation interlayer 52 is formed by means of a plasma CVD step, and resist 53 is spin-coated onto the surface of the resultant structure (see FIG. 2A). Then, an etch-back step is carried out, by using an RIE process such that the same etching rate is used with respect to the resist and the plasma CVD film (see FIG. 2B). Next, SiO$_2$ film 54 is formed by use of the plasma CVD step, followed by the formation of second interconnect aluminum layer 55 (see FIG. 2C).

In this way, second interconnect aluminum layer 55 is formed over planarized first interconnect aluminum layer 51.

As has been set out above, the etch-back method is necessary for the planarization of insulation interlayer 52, but a problem occurs in that a nonuniformity is liable to occur in the film thickness formed, as well as in the amount of etching over the wafer surface. As a result, an adequate degree of insulation cannot be assured between first and second interconnect aluminum layers 51 and 55 at the thinner portion of the insulation interlayer formed by the CVD method, thus shorting may occur at the insulation interlayer. At the thicker portion of the insulation interlayer, on the other hand, no adequate contact hole is formed, by the reactive ion etching, for a satisfactory connection between first and second interconnect aluminum layers 51 and 55.

These problems present an obstacle to the mass manufacture of semiconductor devices, with a stable yield, with necessary working applied.

It is considered that the aforementioned nonuniformity arises due to the fact that the electrochemical reaction of the wafer in the plasma gas atmosphere varies depending upon the state of the wafer. Where, for example, the SOS structure is subjected to the plasma CVD step, a high-frequency voltage is applied to a carbon sheet in the gaseous atmosphere, to thereby create a gaseous plasma, so that a plasma CVD film may be formed. Since, in the SOS structure, for example, sapphire is used as the insulating substrate, a potential on the wafer is never made uniform upon the application of a high-frequency voltage to the carbon sheet, thus causing an unstable state to be induced from the electrical standpoint. As a result, an uneven deposition layer is formed and, moreover, the depth of etching varies during the etching step, such as the RIE step.

SUMMARY OF THE INVENTION

It is accordingly the object of the present invention to provide a method for manufacturing a semiconductor device with a multi-layered interconnect structure formed through utilizing dry steps, which assures a high yield, with improved controllability and reproducibility, and consequently increased reliability.

According to the present invention, a method for manufacturing a semiconductor device is provided, which comprises the steps of:
(1) forming a first conductive layer, on the surface of an insulating substrate;
(2) forming a second conductive layer, on the reverse surface of the insulating substrate;
(3) forming elements in the first conductive layer; and
(4) forming an insulation interlayer by use of a plasma chemical vapor deposition method, and forming contact holes in order to achieve an electrical connection between first and second interconnect metal layers.

With the conductive layer formed over the rear surface of the insulating substrate, the complete surface of the insulating substrate is set at the same potential level in order to cause a uniform electrochemical reaction to occur thereon, so that a layer is formed at a uniform etching step and with a uniform thickness. As a result, a high yield is assured, with improved controllability and reproducibility, as well as consequently increased reliability, in the manufacture of such semiconductor devices.

BRIEF DESCRIPTION OF THE DRAWINGS

FIG. 1 is a view showing an insulating substrate having a conductive layer for use in a semiconductor device;

FIGS. 2A to 2C are views showing a method for manufacturing a semiconductor device having a multilayered interconnect structure:

FIG. 2A being a view showing the steps, subsequent to forming a first interconnect aluminum layer, of forming an insulation interlayer and spin-coating a resist:

FIG. 2B being a view showing the step of carrying out an etch-back step by use of an RIE process: and FIG. 2C being a view showing the step of forming an interconnect aluminum layer subsequent to forming an $SiO_2$ film;

FIGS. 3A to 3E are views showing a method for the manufacture of a semiconductor device according to the present invention:

FIG. 3A being a view showing the step, subsequent to forming a single crystalline silicon layer on the surface of a sapphire substrate, of forming a single crystalline silicon layer on the reverse surface of the sapphire substrate:

FIG. 3B being a view showing the steps, subsequent to the selective etching of the single crystalline layer on the surface of the sapphire substrate, of forming a field oxide film, a gate oxide film, and source and drain, and forming an insulation interlayer and first interconnect aluminum layer:

FIG. 3C being a view showing the step of forming an insulation interlayer on a first interconnect aluminum layer, and spin-coating a resist:

FIG. 3D being a view showing the step of planarizing the insulation interlayer by use of an RIE step: and FIG. 3E being a view showing the step of forming an insulation film on the insulation interlayer, and forming a contact hole to achieve electrical connection between the first and second insulation interlayers.

FIG. 4A being a view showing the step of forming a single crystalline silicon layer on the surface of a sapphire substrate:

FIG. 4B being a view showing the step, subsequent to forming a field oxide film in the single crystalline silicon layer by means of etching and oxidation steps, of forming a polysilicon layer on the top surface of the resultant structure and on the rear surface of the sapphire substrate, etching the polysilicon layer on the surface of the sapphire substrate, by use of an RIE method, to form a gate electrode, and forming a source and drain: and FIG. 4C being a view showing an insulation interlayer; FIG. 5B being a view showing the step of etching the aluminum layer covering the insulation interlayer, by the RIE method, to form a first interconnect layer.

DETAILED DESCRIPTION OF THE PREFERRED EMBODIMENTS

Figure 3D:
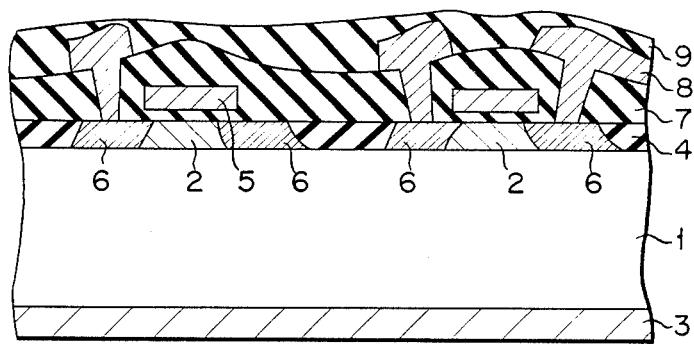

FIGS. 3A to 3E are cross-sectional views showing a method for manufacturing a semiconductor device according to one embodiment of the present invention. Single crystalline silicon layer 2 is epitaxially formed on the surface of insulation substrate 1, for example, a sapphire substrate. Then, as is shown in FIG. 3A, single crystalline silicon layer 3 is formed on the reverse surface of sapphire substrate 1.

In the fabrication of an ordinary MOS transistor, single crystalline silicon layer 2, not shown, is selectively etched to form field oxide film 4 for element separation, gate electrode 5 (polysilicon) and a source and drain, followed by the formation of insulation interlayer 7 and first interconnect aluminum layer 8, as is shown in FIG. 3B.

Then, plasma CVD $SiO_2$ layer 9 is formed to provide an insulation interlayer between first and second interconnect aluminum layers 8 and 13. Resist 10, for "etch-back", is spin coated on CVD $SiO_2$ film 9, as is shown in FIG. 3C.

Figure 3E:
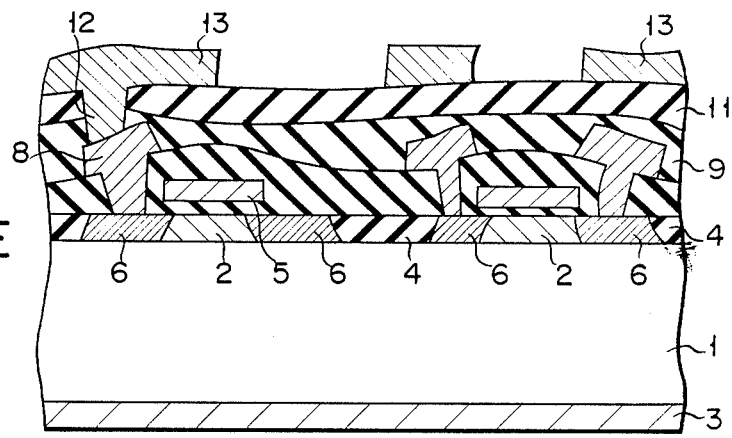

Next, $SiO_2$ layer 9 is planarized by the RIE method as shown in FIG. 3D, followed by the formation of plasma CVD $SiO_2$ layer 11. Contact hole 12 is opened, by the RIE process, to form a connection between first and second interconnect aluminum layers 8 and 13, in which case the second interconnect aluminum layer is formed at a step following the aforementioned opening step, as is shown in FIG. 3E.

Figure 4A:
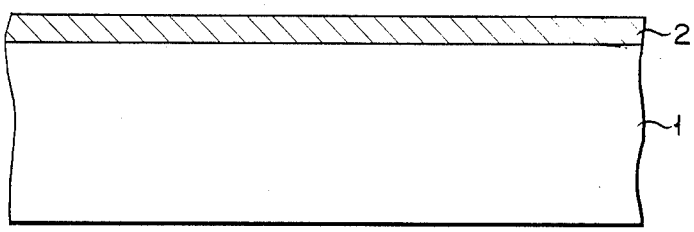
FIGS. 4A to 4C show a method for manufacturing a semiconductor device according to another embodiment of the present invention.
Figure 4B:
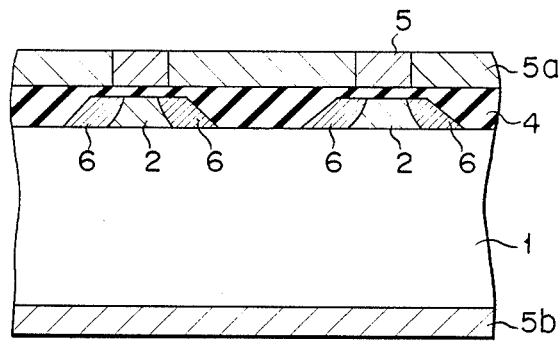
Figure 4C:
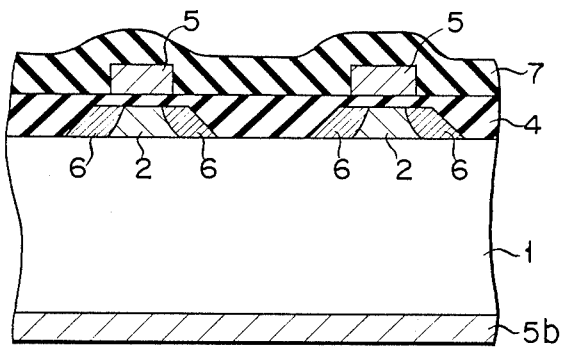

FIGS. 4A to 4C are cross-sectional views showing a method for the manufacture of a semiconductor device according to another embodiment of the present invention.

Single crystalline silicon layer 2 is formed, as is shown in FIG. 4A, on the surface of an insulation substrate, such as sapphire substrate 1. Then, field oxide film 4, for element separation, is formed by subjecting single crystalline silicon layer 2 to selective etching and oxidation steps. Polysilicon layer 5a (gate electrode 5) is formed by an LPCVD (Low Pressure Chemical Vapor Deposition) method, on the surface of the resultant structure, and polysilicon layer 5b is simultaneously, continuously, or subsequently formed on the reverse surface of sapphire substrate 1. Next, the polycrystalline silicon layer covering the surface of sapphire substrate 1 is etched by the RIE method, to thereby form gate electrode 5, and the source and drain are formed as is shown in FIG. 4B.

Insulation interlayer 7 is formed by the CVD method, as is shown in FIG. 4C. Thus, a semiconductor device having two interconnect aluminum layers is manufactured by the same method as shown in FIGS. 3D to 3E.

Figure 5A:
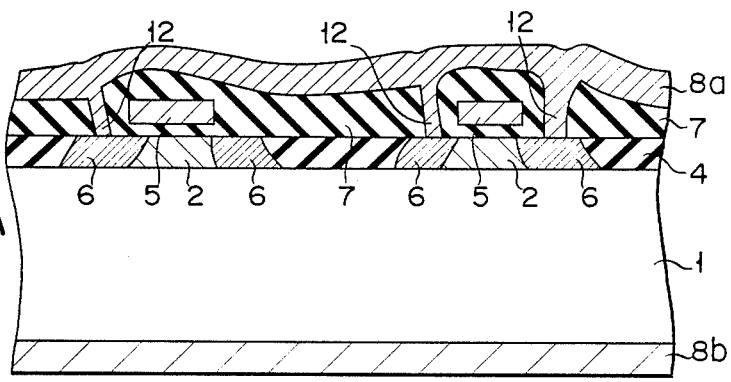
FIGS. 5A and 5B show a method for the manufacture of a semiconductor device according to another embodiment of the present invention, FIG. 5A being a view showing the steps of forming a single crystalline silicon layer on the surface of a sapphire substrate, subjecting the single crystalline silicon layer to etching and oxidation steps, to thereby form a field oxide film, gate electrodes, source, drain, and insulation interlayer, subsequent to opening a contact hole in the insulation interlayer by the RIE method, forming an aluminum layer on the insulation interlayer and on the reverse surface of the sapphire substrate.
Figure 5B:
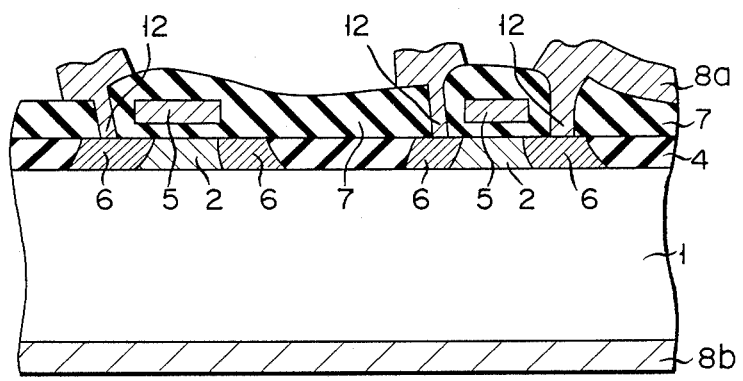

FIGS. 5A to 5B are cross-sectional view showing a method for the manufacture of a semiconductor device according to another embodiment of the present invention.

A single crystalline silicon layer 2 is formed on the surface of insulating substrate 1, for example, a sapphire substrate. Then, field oxide film 4, for element separation, is formed by subjecting to selective etching and oxidation steps, followed by the formation of gate electrode 5, source and drain 6, and insulation interlayer 7.

Next, contact hole 12 is opened, by use of the RIE method, in insulation interlayer 7, and aluminum layer 8a is formed thereon, to cover contact hole 12. At this time, aluminum layer 8b is formed simultaneously, continuously, or seqentially on the rear surface of sapphire substrate 1; as shown in FIG. 5A.

The aluminum layer 8a covering insulation interlayer 7 is etched by the RIE method to provide first interconnect layer 8, as shown in FIG. 5B.

The subsequent steps are the same as are shown in FIGS. 3D to 3E; further explanation is, therefore, omitted.

As has been set out above, according to the present invention, an electroconductive material is formed on the reverse surface of an insulating substrate, such as a sapphire substrate, thereby preventing a nonuniformity in the amount of etching (dry etching) and in the thickness of the layers formed by means of the plasma CVD method.

In the embodiments shown in FIGS. 4 and 5, the steps of manufacturing the semiconductor device can be simplified without the need to form any extra conductive layer.

What is claimed is:

1. A method for manufacturing a semiconductor device, comprising the steps of:
   (1) forming a first conductive layer on a first major surface of an insulating substrate;
   (2) forming a second conductive layer on a second major surface of the insulating substrate;
   (3) forming, subsequent to the formation of said second conductive layer, elements in said first conductive layer; and
   (4) forming an insulating interlayer, for insulation between interconnect layers, by means of a plasma CVD method, and forming contact holes, for achieving connection between the interconnect layers, by means of a reactive ion etching method.

2. The method according to claim 1, wherein said insulation substrate is formed of sapphire.

3. The method according to claim 1, wherein said first and second conductive layers are formed by use of an epitaxial growth method.

4. The method according to claim 1, wherein said first and second conductive layers are formed of a single crystalline silicon.

5. The method according to claim 1, wherein said insulation interlayer is formed of an SiO$_2$ layer.

6. The method according to claim 1, further comprising the step of planarizing said insulation interlayer, by means of a reactive ion etching method.

7. The method according to claim 6, wherein said planarizing step comprises coating a resist, for planarization, on said insulation interlayer, and performing a reactive ion etching step on the surface of a resultant structure.

8. A method for manufacturing a semiconductor device, comprising the steps of:
   (1) forming a first conductive layer on a first major surface of an insulating substrate;
   (2) forming a second conductive layer on said first conductive layer, with an insulating layer formed therebetween, and forming said second conductive layer on a second major surface of said insulating substrate;
   (3) forming a gate electrode by etching said second conductive layer formed on said first major surface of said insulating substrate by means of a reactive iron etching method; and
   (4) forming an insulation interlayer, by means of a plasma chemical vapor deposition method, on the gate electrode, to provide insulating between interconnect layers, and forming contact holes therebetween, through etching the insulation interlayer by means of a reactive ion etching method.

9. The method according to claim 8, wherein said insulating substrate is formed of sapphire.

10. The method according to claim 8, wherein said first conductive layer is formed by use of an epitaxial growth method.

11. The method according to claim 8, wherein said first conductive layer is formed of a single crystalline silicon.

12. The method according to claim 8, wherein said first conductive layer is formed by use of a low-pressure chemical vapor deposition method.

13. The method according to claim 8, wherein said second conductive layer is formed of polysilicon.

14. The method according to claim 8, further comprising the step of planarizing said insulation interlayer, by means of a reactive ion etching method.

15. The method according to claim 14, wherein said planarizing step comprises coating a resist, for planarization, on said insulation interlayer, and performing a reactive ion etching step.

16. A method for manufacturing a semiconductor device, comprising the steps of:
   (1) forming a first conductive layer on a surface of an insulating substrate;
   (2) forming elements in said first conductive layer;
   (3) forming a gate electrode, and an insulation interlayer for insulation between interconnect layers, on the elements formed on said first conductive layer;
   (4) forming contact holes in the insulating layer, to thereby achieve an electrical connection between said interconnect layers;
   (5) forming an interconnect layer over the contact hole, and simultaneously or subsequently forming a second conductive layer on a reverse surface of said insulating substrate; and
   (6) forming an insulation interlayer, by means of a plasma chemical vapor deposition method, on the interconnect layer, and forming contact holes by means of a reactive ion etching method, to achieve an electrical connection between the interconnect layers.

17. The method according to claim 16, wherein said insulation substrate is formed of sapphire.

18. The method according to claim 16, wherein said first conductive layer is formed by means of an epitaxial growth method.

19. The method according to claim 16, wherein said first conductive layer is formed of a single crystalline silicon.

20. The method according to claim 16, wherein said second conductive layer is formed of aluminum.

21. The method according to claim 16, further comprising planarizing said insulation interlayer, through utilizing a reactive ion etching method.

22. The method according to claim 21, wherein said planarizing step is performed by coating a resist over the insulation interlayer, and performing said reactive ion etching method.

* * * * *